United States Patent [19]
Roethlingshoefer et al.

[11] Patent Number: 5,576,934
[45] Date of Patent: Nov. 19, 1996

[54] MOUNTING UNIT FOR A MULTILAYER HYBRID CIRCUIT HAVING POWER COMPONENTS INCLUDING A COPPER COATED CERAMIC CENTER BOARD

[75] Inventors: Walter Roethlingshoefer; Ulrich Goebels, both of Reutlingen, Germany

[73] Assignee: Robert Bosch GmbH, Stuttgart, Germany

[21] Appl. No.: 367,181

[22] PCT Filed: Jun. 24, 1993

[86] PCT No.: PCT/DE93/00548

§ 371 Date: Dec. 9, 1994

§ 102(e) Date: Dec. 9, 1994

[87] PCT Pub. No.: WO94/01889

PCT Pub. Date: Jan. 20, 1994

[30] Foreign Application Priority Data

Jul. 9, 1992 [DE] Germany ............... 42 22 474.8

[51] Int. Cl.$^6$ ............... H05K 1/18; H05K 7/20
[52] U.S. Cl. ............ 361/761; 174/252; 174/257; 174/260; 361/763; 361/764; 361/719; 361/720
[58] Field of Search ............ 174/51, 250, 252, 174/255, 256, 257, 258, 259, 260, 261; 257/705, 709, 710, 711, 712, 717, 723, 724, 728; 333/246, 247; 361/767, 770, 771, 782, 783, 705, 761, 792–795, 719–721, 763, 764; 439/68, 485; 428/209, 901

[56] References Cited

U.S. PATENT DOCUMENTS

| H650 | 7/1989 | Lindenmeyer | 174/261 |
|---|---|---|---|
| 3,517,279 | 6/1970 | Ikeda et al. | 174/252 |
| 4,563,383 | 1/1986 | Kuneman et al. | 428/216 |
| 4,862,323 | 8/1989 | Butt | 361/720 |
| 4,912,284 | 3/1990 | Ransom | 174/258 |
| 5,012,324 | 4/1991 | Martin et al. . | |
| 5,055,967 | 10/1991 | Sukonnik et al. | 174/258 |
| 5,151,769 | 9/1992 | Immorlica, Jr. et al. | 257/728 |
| 5,359,496 | 10/1994 | Kornrumpf et al. | 361/795 |

FOREIGN PATENT DOCUMENTS

| 0434264 | 6/1991 | European Pat. Off. . | |
|---|---|---|---|
| 4031733 | 4/1992 | Germany . | |
| 4-87356 | 3/1992 | Japan | 257/723 |
| WO89/00339 | 1/1989 | WIPO . | |
| WO92/06496 | 4/1992 | WIPO . | |

OTHER PUBLICATIONS

IBM Technical Disclosure Bulletin "Direct Capacitor Attachment for Logic Chips" vol. No. 3A Aug. 1990.

Primary Examiner—Donald A. Sparks
Attorney, Agent, or Firm—Kenyon & Kenyon

[57] ABSTRACT

A mounting unit for a multilayer hybrid circuit having power components provides improved heat dissipation from the power components. The mounting unit includes a thermally conductive substrate board on which the multilayer hybrid circuit is mounted, the substrate board including a ceramic board that is coated with copper film.

5 Claims, 1 Drawing Sheet

MOUNTING UNIT FOR A MULTILAYER HYBRID CIRCUIT HAVING POWER COMPONENTS INCLUDING A COPPER COATED CERAMIC CENTER BOARD

FIELD OF THE INVENTION

The present invention relates to a mounting unit for a multilayer hybrid circuit.

BACKGROUND INFORMATION

The present invention starts out from a mounting unit for a multilayer hybrid circuit. Multilayer hybrids having power components have already been disclosed by the German unexamined Patent Application No. 40 31 733. Multilayer hybrids having power components, especially ICs, are used therein, the power components being mounted, for example, on the top side of the hybrid, and their waste heat being dissipated through somewhat costly designs, by means of cooling plates, heat sinks, or cooling springs. In addition, it discloses introducing power ICs into indentations formed on the back side of the multilayer hybrid, for example, so as to allow the multilayer hybrid to be mounted with its rear side over the full surface on a substrate board. In this case, heat can accumulate at those locations where a power component is mounted on the rear side, since the heat generated is not optimally dissipated through the substrate board.

SUMMARY OF THE INVENTION

In comparison, the arrangement according to the present invention has the advantage of enabling heat to dissipate directly through the substrate board, for example, to a package (housing) mounting base. Another advantage to be considered is that by assembling the power components on the rear side, one can dispense with metal-filled channels, thus making more wiring area available in a plurality of conducting track planes of the multilayer hybrid circuit.

Advantageous further developments and improvements of the multilayer hybrid circuit are possible. It is particularly advantageous to use a ceramic board that is coated on both sides with copper and to provide it with recesses, so that the copper film is tented (stretched) over these recesses and is first pressed into the appropriate indentations when the hybrid is mounted. Thus, an exact adaptation to the various chip thicknesses is possible. A further advantage is that the copper film can be designed at the edge of the substrate board as a projecting lead frame, thus enabling it to be bonded on the one hand to the hybrid and, on the other hand, to a fixed connector. Finally, it is possible to pattern the copper film on the ceramic carrier so as to allow connections to lead away or toward various locations on the multilayer hybrid circuit. In this case, it is particularly advantageous that the connections are able to be designed as low-resistance connections.

DETAILED DESCRIPTION OF THE INVENTION

Figure 1:
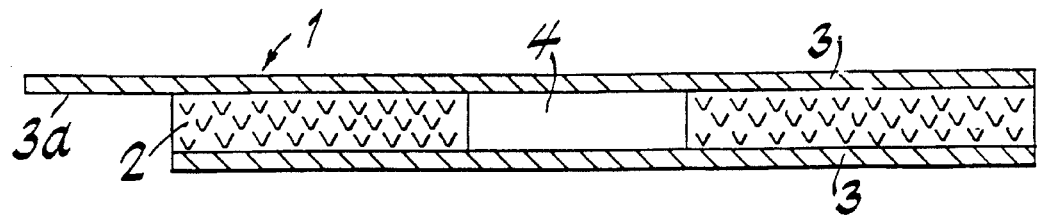
FIG. 1 shows a substrate board according to the present invention having a copper/ceramic/copper layer sequence.

FIG. 1 illustrates the substrate board 1, on which a multilayer hybrid circuit is mounted. This substrate board 1 consists of a ceramic board 2, which is about 0.3 to 2 mm thick. This ceramic board 2 is coated on both sides with a copper film 3. The ceramic board 2 can have indentations 4, which are then tented by the copper films 3.

Figure 2:
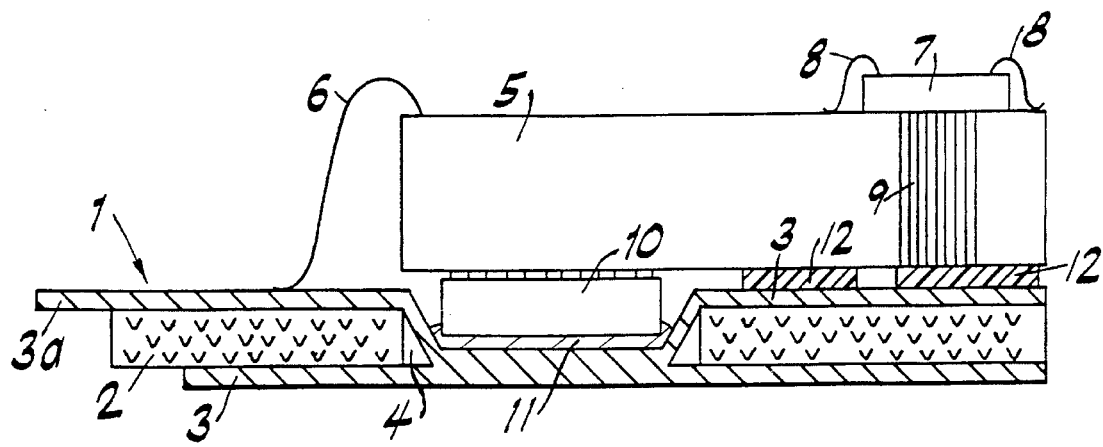
FIG. 2 shows a substrate board according to the present invention with an assembled multilayer hybrid circuit.

FIG. 2 depicts the substrate board 1 with the multilayer hybrid circuit 5 mounted on. Such a multilayer hybrid 5 usually consists of ceramic, with various components, such as resistors and capacitors, being introduced into different layers. The leads of the multilayer hybrid circuit 5 are connected via wires 6 to outer leads (not shown) outside of the multilayer hybrid circuit or to various conducting tracks of the patterned copper film 3. Two power semiconductor components in IC design are secured in various ways to the multilayer hybrid circuit 5. Thus, a power IC 7 is mounted on the top side of the multilayer hybrid circuit and is contacted by means of bonding wires 8 by conducting tracks on the top side of the multilayer hybrid circuit 5. To dissipate its heat to the substrate board 1, a plurality of channels, so-called stacked vias 9 are introduced into the multilayer hybrid and lead right through the entire multilayer hybrid 5, from the power IC 7 to the substrate board 1. The relatively poor heat dissipation in this case to the substrate board is improved under the state of the art by the assembly of power ICs 10 on the rear side of the multilayer hybrid circuit 5, depending on the requirement. These power ICs 10 can be contacted on the multilayer hybrid circuit 5 using methods known per se of flip-chip soldering, for example, as described in U.S. Pat. No. 3,517,279. When the multilayer hybrid circuit 5 is mounted on the substrate board 1, the present invention provides at this point for the power ICs 10 mounted on the rear side of the multilayer hybrid circuit 5 to be brought over the recesses 4 in the ceramic board 2, causing them to press the copper film 3 into the recess 4, so that an indentation is formed, which corresponds exactly to the chip thickness of the power ICs 10. The indentations can be optionally embossed beforehand using appropriate tools. The power ICs 10 are coupled by means of a heat-conductive paste 11 to the copper film 3. The multilayer hybrid circuit 5 is secured to the substrate board 1 using a thermally conductive adhesive agent 12. Thus, no additional structures are needed to dissipate the heat from the power IC 10. The heat generated on the power IC 10 can thus be directly transmitted to the substrate board 1 surrounding it and be conducted away from there to the package mounting base of a switching device or the like.

It is also possible for the projecting copper film 3 to be designed as a lead frame 3a, so that a simple contacting to the outer leads is possible without requiring additional bonding wires.

Figure 3:
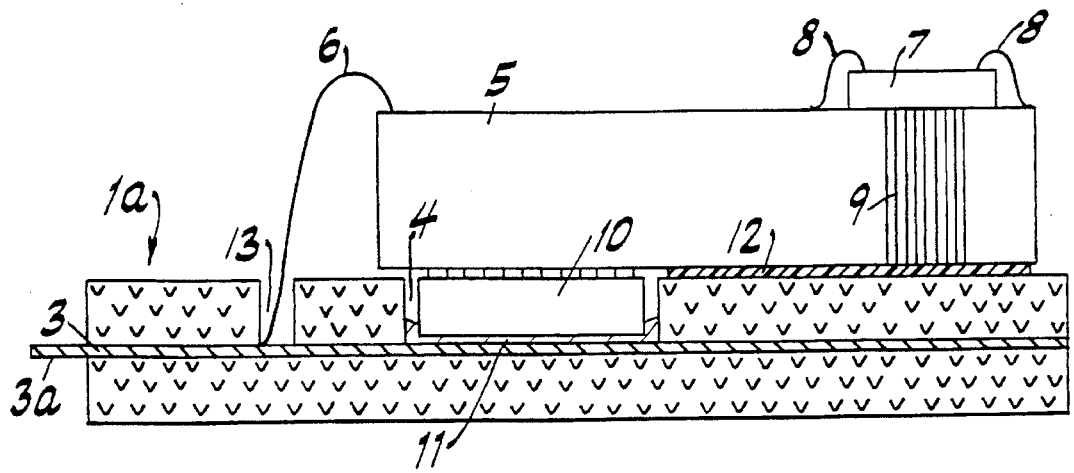
FIG. 3 shows a substrate board according to the present invention having a ceramic/copper/ceramic layer sequence.

FIG. 3 depicts the multilayer hybrid circuit 5 on a substrate board 1a having a ceramic-copper-ceramic layer sequence, i.e., a copper film 3 is coated on both sides with ceramic 2, the ceramic thickness being defined in each case to correspond to the IC thickness. In this case, the IC 10 is likewise coupled by a heat-conductive paste 11 to the copper film 3, while the multilayer hybrid circuit 5 is bonded using the thermally conductive adhesive agent 12 to the substrate board. The contacting between the multilayer hybrid circuit and the copper film 3 takes place via the bonding wires 6 and appropriate contact recesses 13. It is equally possible, however, to run the bonding wire 6 to an external contact, for example to a connector.

The adhesive agent for securing the multilayer hybrid circuit 5 can be applied as a film to the substrate boards 1, 1a, so that—in accordance with FIG. 3—an adhesive surface is formed that corresponds to the size of the multilayer hybrid. It is also conceivable, however, to have locally distributed adhesive points accordance with FIG. 2.

What is claimed is:

1. A mounting unit for a multilayer hybrid circuit having at least one integrated circuit semiconductor power component, comprising:

a substrate board, having a thickness in the range of 0.3 mm to 2.0 mm, including a ceramic center board, the center board being coated on a first side and a second side with a copper film, at least one recess portion being formed in the center board between the first side and the second side, wherein the at least one recess portion receives the at least one integrated circuit semiconductor power component, and the copper film conforms to a chip thickness of the at least one integrated semiconductor power component.

2. The mounting unit according to claim 1, wherein the multilayer hybrid circuit is bonded to the substrate board, the at least one integrated circuit semiconductor power component being arranged on a side of the multilayer hybrid circuit facing towards the substrate board.

3. The mounting unit according to claim 2, wherein the multilayer hybrid circuit is bonded to the substrate board via a heat-conductive paste.

4. The mounting unit according to claim 1, wherein the copper film includes a conductor track pattern.

5. The mounting unit according to claim 1, wherein the copper film includes a lead frame portion for providing an electrical connection.

* * * * *

UNITED STATES PATENT AND TRADEMARK OFFICE
CERTIFICATE OF CORRECTION

PATENT No. : 5,576,934

DATED : November 19, 1996

INVENTOR(S): Walter Roethingshoefer, Ulrich Goebels

It is certified that error appears in the above-identified patent and that said Letters Patent is hereby corrected as shown below:

Title page,

Item [86], § 371 Date: should be --January 9, 1995-- and

§ 102(e) Date: should be --January 9, 1995--.

Signed and Sealed this

Second Day of November, 1999

Attest:

Attesting Officer

Q. TODD DICKINSON

Acting Commissioner of Patents and Trademarks